United States Patent
Khanke et al.

(10) Patent No.: US 8,558,531 B2
(45) Date of Patent: Oct. 15, 2013

(54) METHOD AND SYSTEM FOR INDICATING FAULTS IN AN ELECTRICITY METER

(75) Inventors: Satish Sharadrao Khanke, Andhra Pradesh (IN); Thrishul Patil, Andhra Pradesh (IN)

(73) Assignee: General Electric Company, Schenectady, NY (US)

( * ) Notice: Subject to any disclaimer, the term of this patent is extended or adjusted under 35 U.S.C. 154(b) by 504 days.

(21) Appl. No.: 12/820,666

(22) Filed: Jun. 22, 2010

(65) Prior Publication Data

US 2011/0309820 A1    Dec. 22, 2011

(51) Int. Cl.
*G01R 11/32*    (2006.01)

(52) U.S. Cl.
USPC .......................................................... 324/74

(58) Field of Classification Search
USPC ............ 324/74, 76.11, 99 D, 525; 702/61–65
See application file for complete search history.

(56) References Cited

U.S. PATENT DOCUMENTS

| | | | |
|---|---|---|---|
| 4,835,459 A * | 5/1989 | Hamlin et al. | ............... 324/73.1 |
| 5,248,935 A | 9/1993 | Sakoyama et al. | |
| 5,555,508 A | 9/1996 | Munday et al. | |
| 5,627,759 A | 5/1997 | Bearden et al. | |
| 6,006,016 A * | 12/1999 | Faigon et al. | ................... 714/48 |
| 6,043,642 A | 3/2000 | Martin et al. | |
| 6,067,029 A | 5/2000 | Durston | |
| 6,112,159 A | 8/2000 | Bond et al. | |
| 7,020,566 B2 | 3/2006 | Villicana et al. | |
| 7,120,563 B2 | 10/2006 | Bechhoefer et al. | |
| 7,200,779 B1 * | 4/2007 | Coss et al. | ....................... 714/48 |
| 7,512,503 B2 | 3/2009 | Bechhoefer et al. | |
| 7,571,058 B2 * | 8/2009 | Sealing et al. | ................... 702/34 |
| 7,729,299 B2 * | 6/2010 | Eisenberg et al. | ............ 370/260 |
| 2004/0059585 A1 | 3/2004 | Villicana et al. | |
| 2010/0036624 A1 * | 2/2010 | Martin et al. | ................... 702/61 |

* cited by examiner

*Primary Examiner* — Arleen M Vazquez
*Assistant Examiner* — Feba Pothen
(74) *Attorney, Agent, or Firm* — Armstrong Teasdale LLP (57) ABSTRACT

A method and system for determining a health of a metering system are provided. The metering system includes a meter base including a meter bus couplable between an electrical source and an electrical load, a plurality of sensors configured to determine electrical characteristics of electrical power in the meter bus, and a processor configured to execute at least one code segment. The code segments instruct the processor to determine revenue parameters for the metering system, determine at least one fault of a plurality of possible faults associated with the operation of the metering system using outputs from the plurality of sensors, the determination of the revenue parameters, and a processing fault generated by the processor, determine a severity level of each of the at least one faults, and determine a single value for a health of the metering system using the determined at least one fault.

20 Claims, 7 Drawing Sheets

METHOD AND SYSTEM FOR INDICATING FAULTS IN AN ELECTRICITY METER

BACKGROUND OF THE INVENTION

The field of the invention relates generally to electricity meters, and more specifically, to a system and method for determining and indicating faults in an electricity meter.

Currently, to identify a working status of an electronic energy meter or other energy-measuring device installed in the field, for example, whether the energy-measuring device is measuring accurately and/or reporting measurements accurately, a user, such as a meter reader is required to read various errors and cautions while logged into the meter using software or to visually check error/caution codes displayed on meter LCD and then interpret them based on documentation provided. Interpreting the meaning of the various combinations of errors and cautions may lead to inconsistent diagnosis of a health of the energy-measuring device.

BRIEF DESCRIPTION OF THE INVENTION

In one embodiment, a system for determining a health of a metering system includes a meter base including a meter bus couplable between an electrical source and an electrical load, a plurality of sensors configured to determine electrical characteristics of electrical power in the meter bus, and a processor configured to execute at least one code segment. The code segments instruct the processor to determine revenue parameters for the metering system, determine at least one fault of a plurality of possible faults associated with the operation of the metering system using outputs from the plurality of sensors, the determination of the revenue parameters, and a processing fault generated by the processor, determine a severity level of each of the at least one faults, and determine a single value for a health of the metering system using the determined at least one fault.

In another embodiment, a method of determining a health of a metering system includes receiving indication of at least one fault of a plurality of different possible fault types wherein the plurality of possible fault types include error faults and caution faults and wherein the error faults includes critical and non-critical severity levels and the caution faults include high, medium, and low severity levels. The method also includes determining a number of the at least one faults respective of a total number of the at least one faults supported by the metering system, weighting the severity of the at least one fault using the determined number and the plurality of different possible fault types, and determining a single value for a health of the metering system using the received indication, the determined number, and the weighted severity.

In yet another embodiment, a computer program embodied on a computer-readable medium wherein the computer program includes at least one code segment that configures a processor to receive outputs from a plurality of sensors and determine revenue parameters for an energy metering system using the received outputs. The computer program also includes at least one code segment that configures a processor to determine at least one fault of a plurality of possible faults associated with the operation of the energy metering system using the received outputs, the determination of the revenue parameters, and a processing fault generated by the processor, determine a severity level of each of the at least one faults, and determine a single value for a health of the energy metering system using the determined at least one fault.

BRIEF DESCRIPTION OF THE DRAWINGS

FIG. 1-7 show exemplary embodiments of the method and system described herein.

DETAILED DESCRIPTION OF THE INVENTION

The following detailed description illustrates embodiments of the invention by way of example and not by way of limitation. It is contemplated that the invention has general application to analytical and methodical embodiments of interpreting fault codes, error codes, and/or caution codes generated by electronic equipment in industrial, commercial, and residential applications.

As used herein, an element or step recited in the singular and proceeded with the word "a" or "an" should be understood as not excluding plural elements or steps, unless such exclusion is explicitly recited. Furthermore, references to "one embodiment" of the present invention are not intended to be interpreted as excluding the existence of additional embodiments that also incorporate the recited features.

The present invention is described below with reference to figures and flowchart illustrations of systems, methods, apparatuses, and computer program products according to an embodiment of the invention. It will be understood that each block of the flowchart illustrations, and combinations of blocks in the flowchart illustrations, respectively, may be implemented by computer program instructions. These computer program instructions may be loaded onto a general purpose computer, special purpose computer, or other programmable data processing apparatus to produce a machine, such that the instructions which execute on the computer or other programmable data processing apparatus create means for implementing the functions specified in the flowchart block or blocks.

These computer program instructions may also be stored in a computer-readable memory that can direct a computer or other programmable data processing apparatus to function in a particular manner, such that the instructions stored in the computer-readable memory produce an article of manufacture including instruction means that implement the function specified in the flowchart block or blocks. The computer program instructions may also be loaded onto a computer or other programmable data processing apparatus to cause a series of operational steps to be performed on the computer or other programmable apparatus to produce a computer implemented process such that the instructions that execute on the computer or other programmable apparatus provide steps for implementing the functions specified in the flowchart block or blocks.

Accordingly, blocks of the flowchart illustrations support combinations of means for performing the specified functions, combinations of steps for performing the specified functions and program instruction means for performing the specified functions. It will also be understood that each block of the flowchart illustrations, and combinations of blocks in the flowchart illustrations, can be implemented by special purpose hardware-based computer systems that perform the specified functions or steps, or combinations of special purpose hardware and computer instructions. The inventions may be implemented through an application program running on an operating system of a computer. The inventions also may be practiced with other computer system configurations, including hand-held devices, multiprocessor systems, microprocessor based or programmable consumer electronics, mini-computers, mainframe computers, etc.

Application programs that are components of the invention may include routines, programs, components, data structures, etc. that implement certain abstract data types, perform certain tasks or actions. In a distributed computing environment, the application program (in whole or in part) may be located in local memory, or in other storage. In addition, or in the alternative, the application program (in whole or in part) may be located in remote memory or in storage to allow for the practice of the inventions where tasks are performed by remote processing devices linked through a communications network.

Embodiments of the present invention include energy meter reading software that can read various errors and cautions in generated by the energy meter, perform calculations on the allocated percentage for errors and cautions and generate a single value indicative measure for the energy meter that represents the "meter health" or "energy-measuring device health". Such an indication of health facilitates quicker, more consistent decisions regarding a disposition of the meter or measuring device. Because there are various critical and non-critical combinations of device errors and cautions that can occur in meter, there is a possibility of misinterpretation of the status of the meter or measuring device if left to only the experience of, for example, a field engineer or meter reader. Quickly diagnosing a problem in a meter or measuring device that is measuring electricity revenue may mean a measurement that is more accurate and less of a loss of revenue for the owner of the meter or measuring device.

Figure 1:
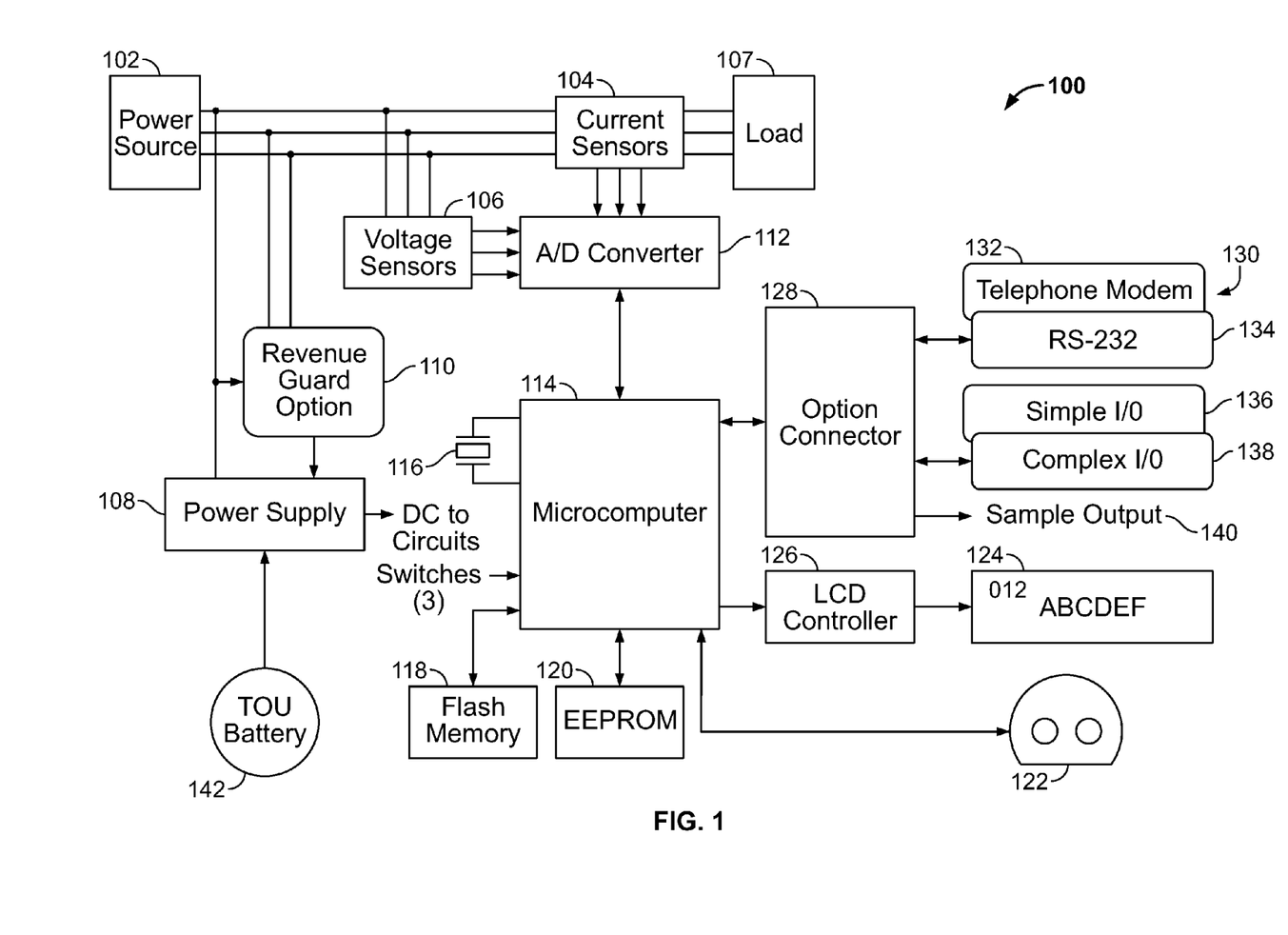
FIG. 1 is a block diagram of an electricity meter 100 in accordance with an exemplary embodiment of the present invention.

FIG. 1 is a block diagram of an electricity meter 100 in accordance with an exemplary embodiment of the present invention. Meter 100 is coupled to a power source 102, for example, three phase, alternating current (AC). Particularly, current sensors 104 and voltage sensors 106 are coupled to power source 102 and generate measures of current and voltage, respectively supplied to a load 107. In addition, a power supply 108 and a revenue guard option board 110 also are coupled to power source 102.

Current and voltage measurements output by sensors 104 and 106 are supplied to an analog-to-digital (A/D) converter 112. Converter 112, in the exemplary embodiment, is an 8 channel delta-sigma type converter. Converter 112 is coupled to a processor or microcomputer 114. In the illustrated embodiment, microcomputer 114 is a 32 bit microcomputer with 2 Mbit ROM, 64 Kbit RAM. A 32 kHz crystal 116 provides a timekeeping signal for microcomputer 114. Microcomputer 114 is coupled to a flash memory 118 and a electronically erasable programmable (i.e., reprogrammable) read only memory (EEPROM) 120.

Meter 100 also includes an optical port 122 coupled to, and controlled by, microcomputer 114. Optical port 122, as is well known in the art, is used for communicating data and commands to and from an external reader to microcomputer 114. Communications via port 122 are performed in accordance with ANSI C12.18 (optical port) and ANSI C12.19 (standard tables). A liquid crystal display 124 also is coupled to microcomputer 114 via an LCD controller 126. In addition, an option connector 128, coupled to microcomputer 114, is provided to enable coupling option boards 130 (e.g., a telephone modem board 132 or an RS-232 line 134, or a simple input/output (I/O) board 136 or a complex I/O board 138) to microcomputer 114. Option connector 128 also includes a sample output 140. When configured to operate in a time-of-use mode, a battery 142 is coupled to power source 102 to serve as a back-up to maintain date and time in the event of a power outage.

Figure 2:
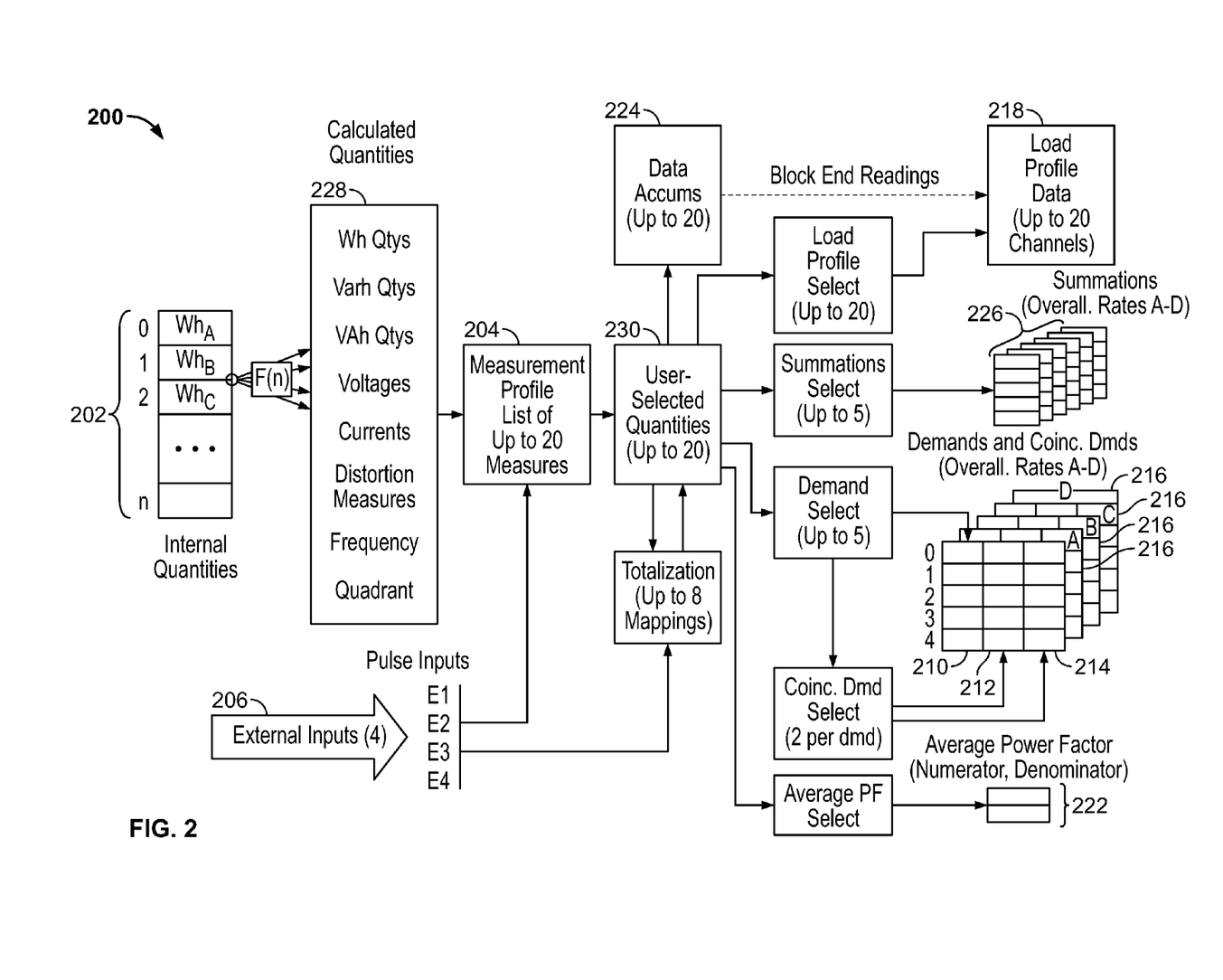
FIG. 2 is a data flow diagram for the electricity meter shown in FIG. 1.

FIG. 2 is a data flow diagram 200 for electricity meter 100 (shown in FIG. 1). As illustrated by FIG. 2, quantities such as watt hours per phase (WhA, WhB, WhC) as well as other quantities are determined by microcomputer 114. These quantities are sometimes referred to herein as internal quantities 202. Microcomputer 114 then uses the pre-defined or user-selected functions F(n) to calculate a set of quantities (referred to as calculated quantities 228). Microcomputer 114 then uses the measurement profile 204 to select up to 20 quantities to store as user-selected quantities. In addition, external inputs 206 can be specified to be accumulated by measurement profile 204. In the embodiment shown in FIG. 2, up to four external inputs (E1, E2, E3, E4) are collected. These may also be scaled by programmed multipliers and divisors.

User-selected quantities 230 specified by measurement profile 204 can be used to perform totalization. For example, a value from a register location in user-selected quantities 230 (e.g., register 7) can be added to a value stored in a register location (e.g., register 17) to provide a totalized value, and the totalized value is stored in a register location (e.g., register 17). In the embodiment illustrated in FIG. 2, up to 8 totalizations can be performed.

Also in the embodiment shown in FIG. 2, five demand values (locations 0-4) 210 can be calculated from the quantities in user-selected quantities 230. The values to use for the demand calculations are specified by the demand select. Each demand value may have up to two coincident demands 212, 214 per demand 210. The coincident demands are specified by the coincident select. A coincident demand value may be another one of the selected demands, or the quotient of two selected demands. An average power factor 222 is stored in numerator and denominator form. Time-of-use summaries (A-D) 216 for the selected demands are also available in a time-of-use meter. Up to 20 quantities can be recorded in load profile data 218. The quantities to be recorded are specified by the load profile select. Up to five summations 226 can be calculated. The quantities to be calculated are specified by the summations select. Time of use summaries (A-D) 216 for the selected summations are also available in a time-of-use meter. Data accumulations 224, summations 226, demands 210 coincident demands 212, 214, and time-of-use summaries 216 may be selected for display 124 on the meter's LCD.

Meter 100 can be programmed by an operator, e.g., a utility, so that meter 100 determines desired quantities, regardless of whether that quantity is a common, IEEE-defined value such as apparent volt-ampere-hours, or a quantity used only by a particular utility. Generally, a momentary interval is defined as 60 cycles (for 60 Hz installations) or 50 cycles (for 50 Hz installations) of the fundamental voltage frequency. Known meters calculate a pre-defined set of quantities from the basic quantities every momentary interval. These quantities include total watt-hours (fundamental plus harmonics), apparent volt-ampere-hours, and arithmetic apparent volt-ampere hours. These quantities are summed by the minute. One-minute accumulations of data are stored in a structure called the minute first-in, first-out (FIFO) register.

Data is retrieved from the minute FIFO and added to other accumulators, from which summations (e.g. total kilowatt-hours), demand calculations (e.g. maximum kilowatt demand), and load profile recording operations are performed.

Typically there is very little flexibility provided by electricity meters in how the momentary interval basic quantities are processed to generate the revenue quantities that are of interest to utilities. A user may, for example, select from several pre-defined quantities that are computed every momentary interval, and the user may select the length of the demand interval or subinterval and the length of the load profile interval.

In contrast, meter 100 enables a user to define methods of data calculations at all points in the data processing sequence, e.g., at the end of a momentary interval, at the end of a minute, at the end of a demand (sub)interval, and at the end of a load profile interval.

In another embodiment, code is downloaded into an external flash memory, and then a measurement profile is programmed to use the calculation specified by the code. Vectors are used to update and perform a list of tasks in ROM, or are replaced by versions in flash memory for other function blocks.

In the exemplary embodiment, meter 100 monitors its operation and the execution of software and generates fault indications that are used to provide a single value output to provide a meter health indicator. The fault indications include at least indications of errors and indications of cautions wherein the indications of errors indicate a fault relatively more severe to the operation of meter 100 than the indications of cautions. The single value output is determined using, for example an algorithm such as the algorithm described below.

Terms used in the meter health algorithm are defined below as:

$X$ = Number of Critical errors that have occurred in meter 100 (If X is >0 then X=1 else X =0),
$Y$ = Number of Non-critical errors that have occurred in meter 100 (If Y is >0 then Y=1 else Y=0),
$A$ = Number of High Severity Cautions that have occurred in meter 100 (If A is >0 then A=1 else A=0),
$B$ = Number Of Medium Severity Cautions that have occurred in meter,
$C$ = Number Of Low Severity Cautions that have occurred in meter,
$Bt$ = Total Number Of Medium Severity Cautions supported by meter 100,
$Ct$ = Total Number Of Low Severity cautions supported by meter 100,
$Ep$ = % contribution of all errors in meter health,
$Cp$ = % contribution of all cautions in meter health, wherein
    Ep and Cp are predetermined, for example, by meter design engineers based on various factors, such as, but not limited to, a fault that causes an incorrect energy consumption data recording in the device or a fault that causes a change in internal device configuration due to an impact from an external environmental condition or a fault generation in the device hardware or a possible defect in a firmware application that is executing in the metering device that causes the metering device to generate either an error or a caution in the metering device.
$Xce$ = % contribution (weight) for critical errors
$Ynce$ = % contribution (weight) for Non-Critical errors
$Xc = (Xce / 100) * Ep$,
    Xc is an engineering constant derived from a total contribution of meter health due to critical errors.
$Ync = (Ynce / 100) * Ep$
    Ync is an engineering constant derived from a total contribution of meter health due to non-critical errors.
$Ach$ = % contribution (weight) for high severity cautions
$Bcm$ = % contribution (weight) for medium severity cautions
$Ccl$ = % contribution (weight) for low severity cautions
$Ah = (Ach / 100) * Cp$
    Ah is an engineering constant derived from total contribution of meter health due to high severity cautions
$Bm = (Bcm / 100) * Cp$
    Bm is an engineering constant derived from total contribution of meter health due to medium severity cautions
$Cl = (Ccl / 100) * Cp$
    Cl is an engineering constant derived from total contribution of meter health due to low severity cautions.
% Energy Meter Health =
    $[1 - [(X * Xc) + (Y * Ync) + (A * Ah) + (B * Bm/Bt) + (C * Cl) / Ct]] * 100$
    % Energy Meter Health is a determination of a single value output that provides an indication of a health of meter 100. % Energy Meter Health facilitates eliminating various human interpretations for various working conditions of meter 100 because of a plurality of possible combinations of critical and non-critical errors and cautions. The weighting of the criticality of the different possible faults and the number of possible faults compared to the number available provides a normalized single value to aid diagnosing whether meter 100 should be replaced immediately, reprogrammed, or other disposition.

Figure 3:
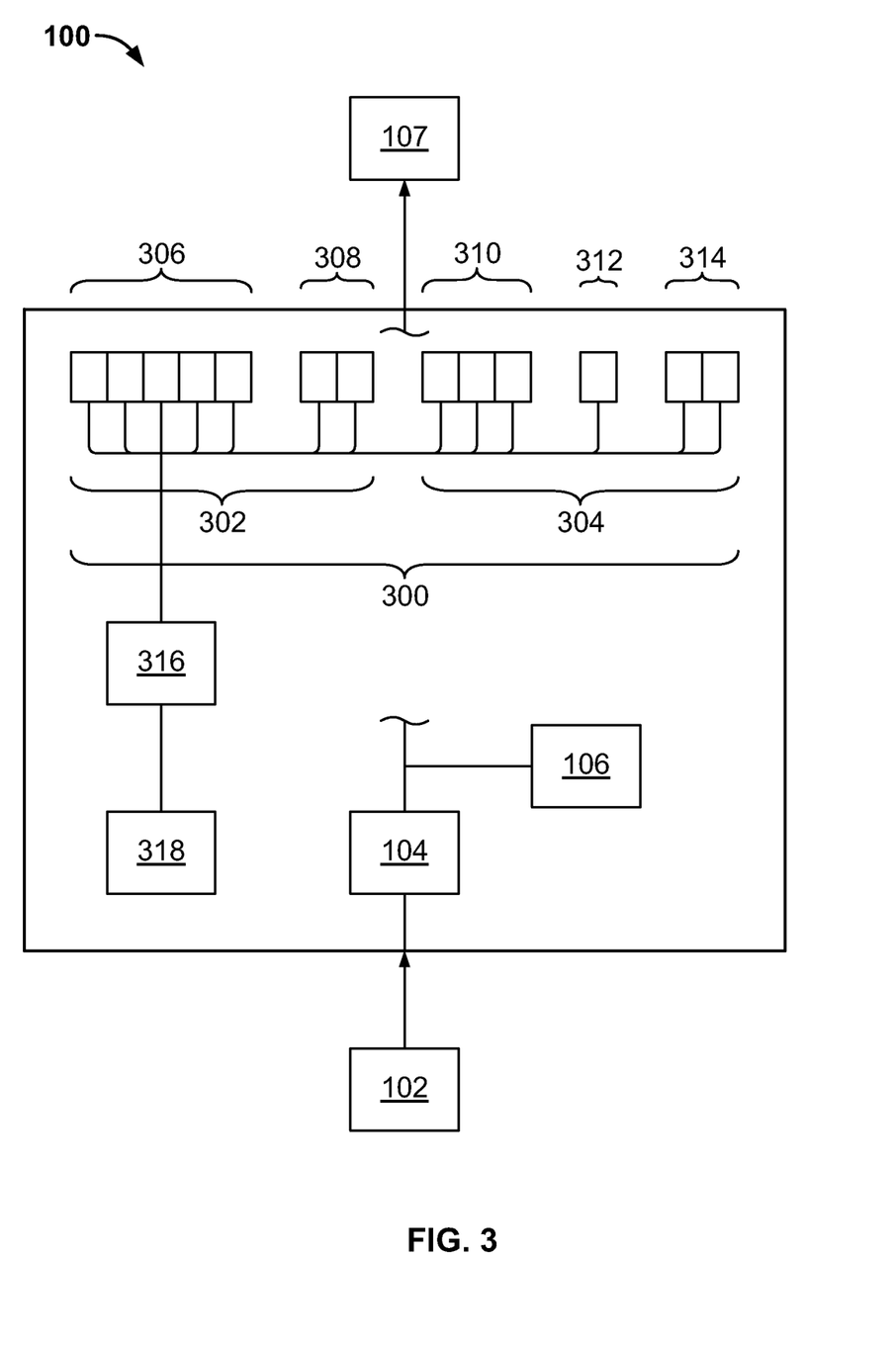
FIG. 3 is a schematic block diagram of a portion of the meter shown in FIG. 1 in accordance with an exemplary embodiment of the present invention.

FIG. 3 is a schematic block diagram of a portion of meter 100 in accordance with an exemplary embodiment of the present invention. In the exemplary embodiment, meter 100 includes a plurality of bit registers 300 that each are associated with one fault of a plurality of possible faults associated with meter 100. The plurality of faults being indicative of a health of meter 100. However, each of the faults may be more or less severe to the health of meter 100 than others of the plurality of possible faults. For example, some faults may represent errors 302 and some faults may represent cautions 304 relating to the operation of meter 100, which in the exemplary embodiment are less severe than the errors. Additionally, errors 302 are further divided into critical errors 306 and non-critical errors 308. Cautions 304 are also divided into high severity cautions 310, medium severity cautions 312, and low severity cautions 314. Each bit of register 300 is read periodically by microcomputer 114 to determine a status of the bit. Alternatively, each bit of register 300 is read periodically by a processor 316 separate from microcomputer 114, in which case processor 316 and microcomputer 114 are communicatively coupled. Additionally, a change in a bit may cause an interrupt or initiate another process that indicates to processor 316 or microcomputer 114 that one of the bits of registers 300 has changed. Processor 316 is communicatively coupled to an output module 318. Output module 318 may be embodied in software or may be a hardware module, such as a display or transmitter, or may be a combination thereof, for example a software driver associated with a display.

During operation, meter 100 is coupled to, for example, a three phase, alternating current (AC) power source 102 and load 107. Current sensors 104 and voltage sensors 106 generate signals representative of revenue parameters that are computed by microcomputer 114. When one or more faults including, for example, a fault that causes an incorrect energy consumption data recording, a change in internal metering system configuration due to an external environmental condition, a fault generation in the metering system hardware, or a firmware application error are detected in meter 100, one or more of the bits in registers 300 are set. As processor 316 executes the % Energy Meter Health algorithm, a new value for % Energy Meter Health is determined and output for use by downstream processes or a user. % Energy Meter Health algorithm may also be only initiated manually by a user in response to an input from the user. The % Energy Meter Health may be used to generate aural or visual indicators or warnings such as, but not limited to a noise associated with the % Energy Meter Health or illuminating a light and/or displaying a text block. Moreover, the combinations of the set bits or the determined faults may be used to generate aural and/or visuals warnings directly.

Figure 4:
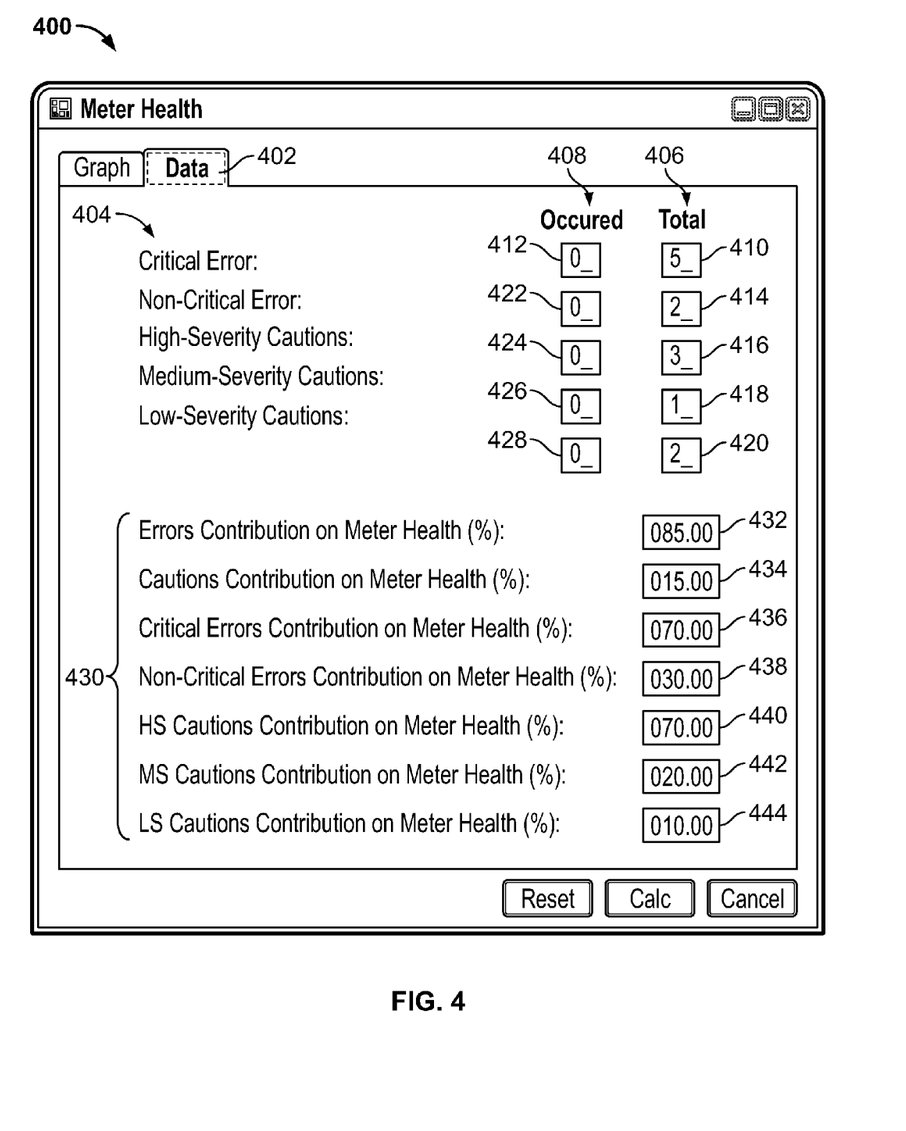
FIG. 4 illustrates an exemplary user interface for the display of the % Energy Meter Health algorithm in accordance with an exemplary embodiment of the present invention.

FIG. 4 illustrates an exemplary user interface 400 for the display of the % Energy Meter Health algorithm in accordance with an exemplary embodiment of the present invention. In the exemplary embodiment, a data tab 402 is used to select a display of % Energy Meter Health algorithm parameters. A parameter identification for the different types of faults is listed in a first column 404. A second column 406 indicates a total number of each type of fault is supported by the particular meter 100. A third column 408 indicates the number of faults of each type that has occurred in meter 100. A field 410 corresponds to a total number of different critical errors supported by meter 100 and currently indicates that meter 100 supports five critical errors. A field 412 corresponds to term X and indicates that meter 100 has experienced zero critical errors. Similarly, a field 414 corresponds to a total number of different non-critical errors supported by meter 100, a field 416 corresponds to a total number of high severity cautions supported by meter 100, a field 418 corresponds to the term Bt in the % Energy Meter Health algorithm described above, a field 420 corresponds to the term Ct in the % Energy Meter Health algorithm described above, a field 422 corresponds to term Y, a field 424 corresponds to term A, a field 426 corresponds to term B, and a field 428 corresponds to term C.

A lower portion 430 of data tab 402 includes fields for other values of terms of the % Energy Meter Health algorithm. For example, a field 432 corresponds to term $E_p$, a field 434 corresponds to term $C_p$, a field 436 corresponds to term Xce, a field 438 corresponds to term Ynce, a field 440 corresponds to term Ach, a field 442 corresponds to term Bcm, and a field 444 corresponds to term Ccl.

User interface 400 may be controlled by a program code residing on meter 100 or on a remote processing device (not shown) communicatively couplable to meter 100. User interface 400 reads % Energy Meter Health algorithm parameters from meter 100 and populates the fields shown in FIG. 4. Using the values of the parameters the % Energy Meter Health algorithm determines the single value representing the health of meter 100.

Figure 5:
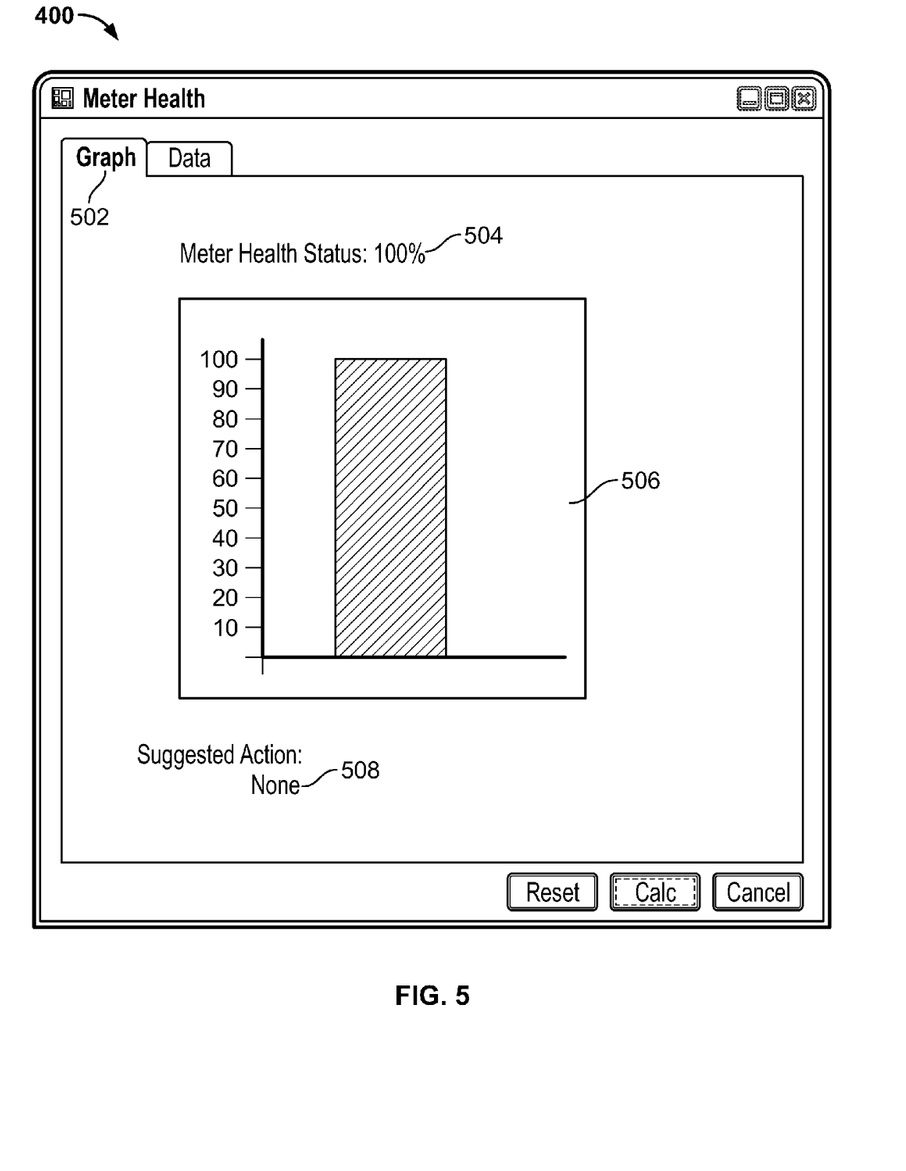
FIG. 5 illustrates the user interface shown in FIG. 4 for the display of a single value for a health of the meter in accordance with an exemplary embodiment of the present invention.

FIG. 5 illustrates user interface 400 for the display of a single value for a health of meter 100 in accordance with an exemplary embodiment of the present invention. In the exemplary embodiment, a graph tab 502 is used to display the single value for a health of meter 100. In a first field 504 the single value for a health of meter 100 is expressed as a percentage value wherein 100% represents that meter 100 is in good health and no corrective actions are warranted. A field 506 illustrates the single value for the health of meter 100 as a bar graph to visually aid a user in quickly recognizing the health of meter 100. The bar graph may be color-coded to assist a user in identifying a status of meter 100. A field 508 displays a recommendation for a corrective action associated with the single value for the health of meter 100 as displayed in fields 504 and 506.

Figure 6:
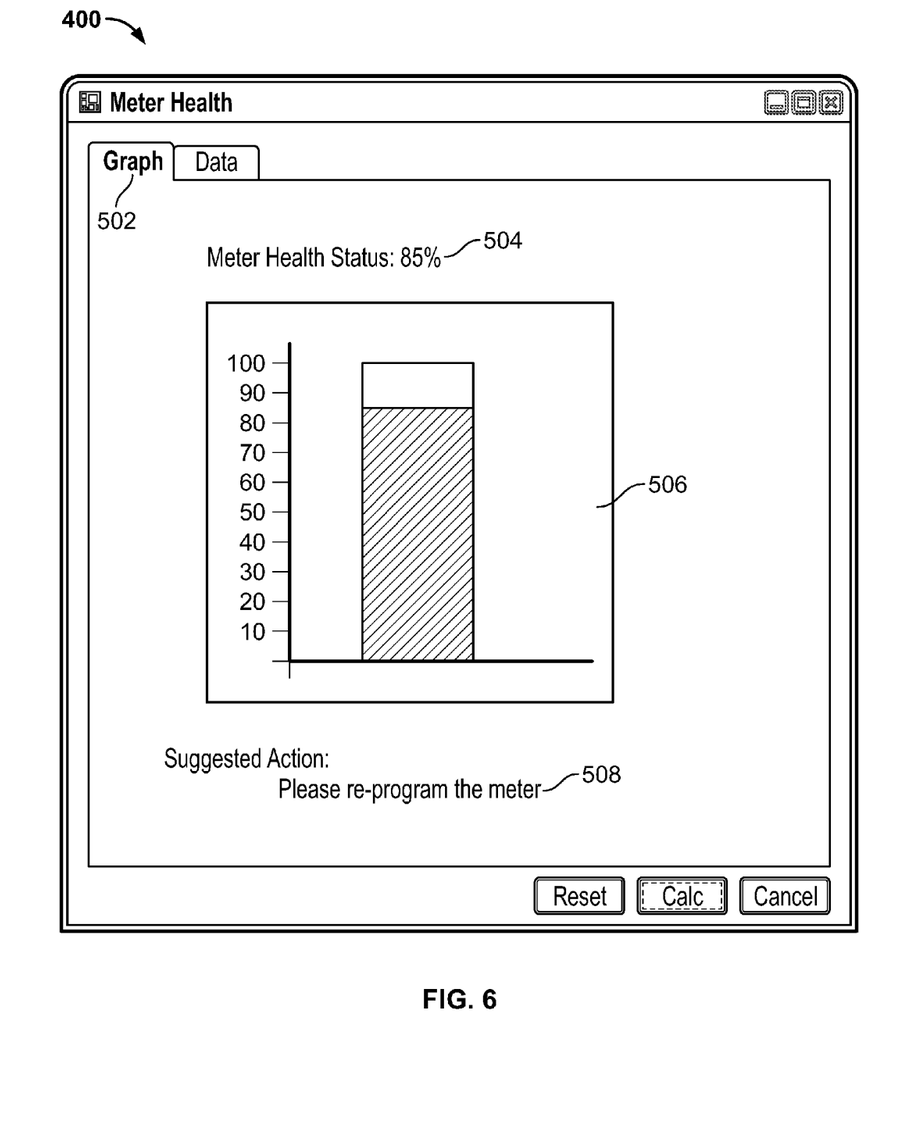
FIG. 6 illustrates the user interface shown in FIG. 4 for the display of a single value for a health of the meter in accordance with an exemplary embodiment of the present invention.

FIG. 6 illustrates user interface 400 for the display of a single value for a health of meter 100 in accordance with an exemplary embodiment of the present invention. In the exemplary embodiment, graph tab 502 is associated with field 424 containing a "1" value, field 426 containing a "1" value, and field 428 containing a "2" value. In first field 504 the single value for a health of meter 100 is 85%. Field 506 illustrates the single value for the health of meter 100 as a bar graph representing 85%. The bar graph may be color-coded to assist a user in identifying a status of meter 100. Field 508 displays a recommendation for a corrective action associated with the single value for the health of meter 100 as displayed in fields 504 and 506 as being a recommendation to reprogram or to reset meter 100.

Figure 7:
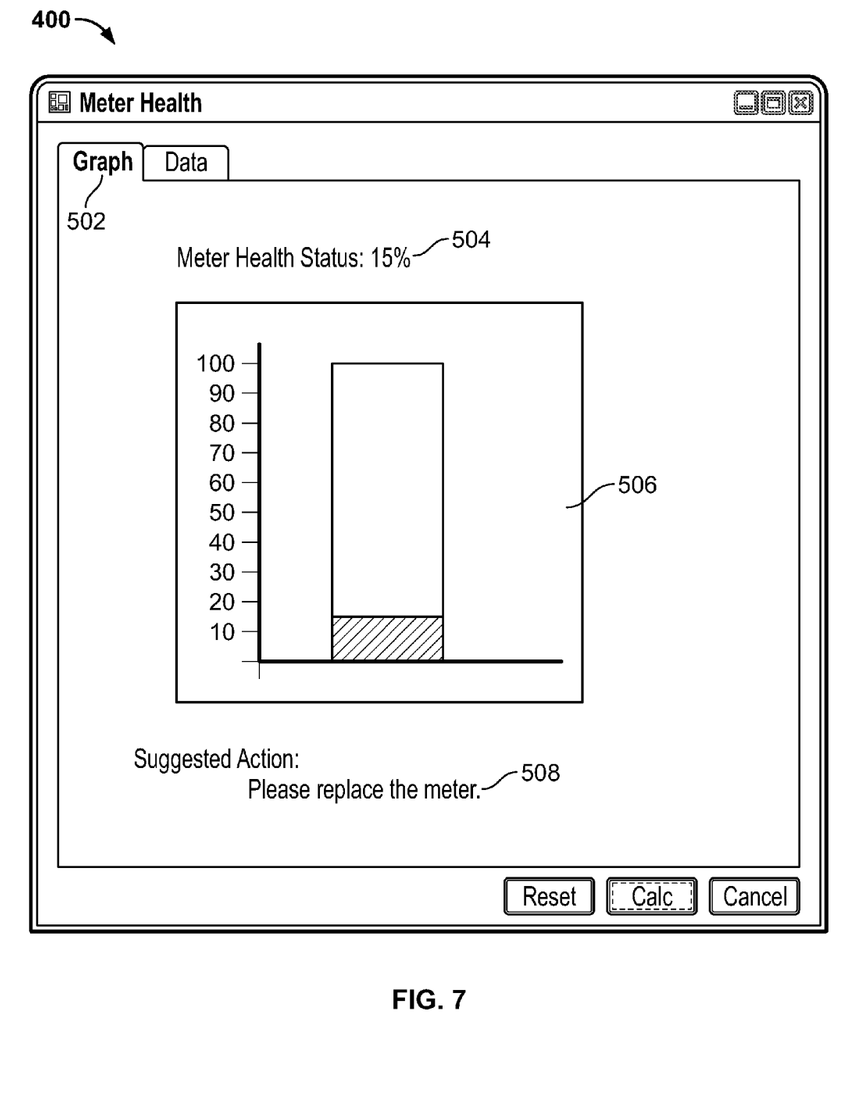
FIG. 7 illustrates the user interface for the display of a single value for a health of the meter in accordance with an exemplary embodiment of the present invention.

FIG. 7 illustrates user interface 400 for the display of a single value for a health of meter 100 in accordance with an exemplary embodiment of the present invention. In the exemplary embodiment, graph tab 502 is associated with field 412 containing a "1" value and field 422 containing a "1" value. In first field 504 the single value for a health of meter 100 is 15%. Field 506 illustrates the single value for the health of meter 100 as a bar graph representing 15%. The bar graph may be color-coded to assist a user in identifying a status of meter 100. Field 508 displays a recommendation for a corrective action associated with the single value for the health of meter 100 as displayed in fields 504 and 506 as being a recommendation to replace meter 100.

The term processor, as used herein, refers to central processing units, processors, microprocessors, microcontrollers, microcomputers, reduced instruction set circuits (RISC), application specific integrated circuits (ASIC), logic circuits, and any other circuit or processor capable of executing the functions described herein.

As used herein, the terms "software" and "firmware" are interchangeable, and include any computer program stored in memory for execution by processor 316 and/or microcomputer 114, including RAM memory, ROM memory, EPROM memory, EEPROM memory, and non-volatile RAM (NVRAM) memory. The above memory types are exemplary only, and are thus not limiting as to the types of memory usable for storage of a computer program.

As will be appreciated based on the foregoing specification, the above-described embodiments of the disclosure may be implemented using computer programming or engineering techniques including computer software, firmware, hardware or any combination or subset thereof, wherein the technical effect is for receiving a plurality of fault indications relating to the operation of an electricity revenue meter and generating a single value for a health of the meter. The single value is used to facilitate quickly determining a course of action for returning the meter to service if necessary. Any such resulting program, having computer-readable code means, may be embodied or provided within one or more computer-readable media, thereby making a computer program product, i.e., an article of manufacture, according to the discussed embodiments of the disclosure. The computer-readable media may be, for example, but is not limited to, a fixed (hard) drive, diskette, optical disk, magnetic tape, semiconductor memory such as read-only memory (ROM), and/or any transmitting/receiving medium such as the Internet or other communication network or link. The article of manufacture containing the computer code may be made and/or used by executing the code directly from one medium, by copying the code from one medium to another medium, or by transmitting the code over a network.

The above-described embodiments of a method and system of determining a health of a metering system provides a cost-effective and reliable means for eliminating interpretative differences by different users for symptoms or faults displayed by the meter. As a result, the method and system described herein facilitate early detection of fault conditions and remediation of the meter failures represented by those fault conditions in a cost-effective and reliable manner.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A metering system comprising:
   a meter base comprising a meter bus couplable between an electrical source and an electrical load;
   a plurality of sensors configured to determine electrical characteristics of electrical power in the meter bus; and
   a processor configured to execute at least one code segment programmed to:
      receive outputs from the plurality of sensors;
      determine revenue parameters for the metering system;
      determine a plurality of faults of a plurality of possible fault types associated with the operation of the metering system using outputs from the plurality of sensors, the determination of the revenue parameters, and a processing fault generated by the processor;
      determine a type of fault for each of the plurality of faults, wherein each type of fault includes a severity level; and
      determine a single value for a health of the metering system using at least the severity level of each type of fault of the plurality of faults.

2. The metering system of claim 1, wherein the processor is further configured to associate combinations of the plurality of faults with a single value for a health of the metering system.

3. The metering system of claim 1, wherein the plurality of possible faults are grouped into severity groups comprising an error severity group and a caution severity group.

4. The metering system of claim 3, wherein the plurality of possible faults in the error severity group comprise at least a critical error level and a non-critical error level.

5. The metering system of claim 3, wherein the plurality of possible faults in the caution severity group comprise at least a high severity caution level, a medium severity caution level, and a low severity caution level.

6. The metering system of claim 1, wherein the processor is further configured to determine a severity level of each of the plurality of faults using a bit set in a register, each bit associated with one fault of the plurality of possible faults.

7. The metering system of claim 1, wherein the plurality of faults include at least an error and a caution wherein the severity level of the error is greater than the severity level of the caution.

8. The metering system of claim 1, wherein the processor is further configured to determine a single value for a health of the metering system using one or more contribution factors including a first contribution value ($E_p$) for errors to the health of the metering system and a second contribution value ($C_p$) for cautions to the health of the metering system.

9. The metering system of claim 8, wherein $E_p$ and $C_p$ are selected based on at least one of a fault that causes an incorrect energy consumption recording, a fault that causes a change in internal metering system configuration due to an external environmental condition, a fault generation in the metering system hardware, or a firmware application error.

10. A method of determining a health of a metering system, said method comprising:
    receiving indication of a plurality of faults of a plurality of possible fault types, wherein the plurality of possible fault types include error faults and caution faults, the error faults include critical and non-critical severity levels, the caution faults include high, medium, and low severity levels;
    determining a number of the plurality of faults respective of a total number of the plurality of possible fault types supported by the metering system;
    weighting the severity of each of the plurality of faults using the determined number and the plurality of possible fault types; and
    determining a single value for a health of the metering system using the received indication, the determined number, and the weighted severity.

11. A method in accordance with claim 10, wherein receiving indication of a plurality of faults comprises reading a bit in a register associated with each fault in the plurality of faults.

12. A method in accordance with claim 10, wherein weighting the severity of each fault further comprises determining a weight of at least one fault that causes an incorrect energy consumption data recording, a change in internal metering system configuration due to an external environmental condition, a fault generation in the metering system hardware, and a firmware application error relative to an error fault or a caution fault.

13. A method in accordance with claim 10, wherein determining a single value for a health of the metering system comprises combining a weighted severity of all existing faults.

14. A computer program embodied on a non-transitory computer-readable medium, said computer program comprising at least one code segment that configures a processor to:
receive outputs from a plurality of sensors;
determine revenue parameters for an energy metering system using the received outputs;
determine a plurality of faults of a plurality of possible fault types associated with the operation of the energy metering system using the received outputs, the determination of the revenue parameters, and a processing fault generated by the processor;
determine a type of fault for each of the plurality of faults, wherein each type of fault includes a severity level; and
determine a single value for a health of the energy metering system using at least the severity level of each type of fault of the plurality of faults.

15. A computer program in accordance with claim 14, wherein said at least one code segment further configures the processor to associate combinations of the plurality of faults with a single value for a health of the metering system.

16. A computer program in accordance with claim 14, wherein said at least one code segment further configures the processor to determine a severity level of each of the plurality of faults using a bit set in a register, each bit associated with one fault of the plurality of possible faults.

17. A computer program in accordance with claim 14, wherein said at least one code segment further configures the processor to determine a single value for a health of the metering system using a first contribution value ($E_p$) for errors to the health of the metering system and a second contribution value ($C_p$) for cautions to the health of the metering system.

18. A computer program in accordance with claim 14, wherein said at least one code segment further configures the processor to determine a single value for a health of the metering system using at least one of a fault that causes an incorrect energy consumption data recording, a fault that causes a change in internal metering system configuration due to an external environmental condition, a fault generation in the metering system hardware, or a firmware application error.

19. The metering system of claim 1, wherein the processor is further configured to determine revenue parameters for the metering system based on output from one or more of current sensors and voltage sensors.

20. A computer program in accordance with claim 14, wherein said at least one code segment further configures the processor to determine revenue parameters for the metering system based on output from one or more of current sensors and voltage sensors.

* * * * *